(12) United States Patent
Burke et al.

(10) Patent No.: US 8,906,244 B2
(45) Date of Patent: Dec. 9, 2014

(54) METHOD FOR FORMING A DEVICE HAVING NANOPILLAR AND CAP STRUCTURES

(71) Applicant: U.S. Army Research Laboratory, Adelphi, MD (US)

(72) Inventors: Robert A Burke, Rockville, MD (US); Alan S Edelstein, Alexandria, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 58 days.

(21) Appl. No.: 13/659,963

(22) Filed: Oct. 25, 2012

(65) Prior Publication Data

US 2014/0116981 A1    May 1, 2014

(51) Int. Cl.
*H01B 13/00* (2006.01)
*B44C 1/22* (2006.01)
*G03F 7/20* (2006.01)

(52) U.S. Cl.
CPC .............. *G03F 7/2037* (2013.01); *B44C 1/227* (2013.01)
USPC ............................................. 216/13; 430/15

(58) Field of Classification Search
None
See application file for complete search history.

(56) References Cited

U.S. PATENT DOCUMENTS

| 5,318,887 | A | * | 6/1994 | Takada et al. | 430/569 |
| 5,853,948 | A | * | 12/1998 | Sawano et al. | 430/166 |
| 5,916,733 | A | * | 6/1999 | Koyama | 430/296 |
| 6,218,056 | B1 | * | 4/2001 | Pinarbasi et al. | 430/5 |
| 2001/0046790 | A1 | * | 11/2001 | Matsukuma | 438/780 |
| 2002/0042028 | A1 | * | 4/2002 | Kamijima | 430/323 |
| 2004/0248047 | A1 | * | 12/2004 | Kato | 430/313 |
| 2013/0298402 | A1 | * | 11/2013 | Knierim | 29/890.1 |

* cited by examiner

*Primary Examiner* — Binh X Tran
*Assistant Examiner* — David Cathey, Jr.
(74) *Attorney, Agent, or Firm* — Alan I. Kalb

(57) ABSTRACT

A method for forming a device having nanopillar and cap structures on a substrate in which the substrate is first coated with a first resist having a first exposure dose to electron beam radiation, and that after coating the first resist with a second resist having a second exposure dose less than the first resist. Electron beam lithography is then used sequentially to form the nanopillars and cap structures or, alternatively, a template for the nanopillar and cap structures.

4 Claims, 4 Drawing Sheets

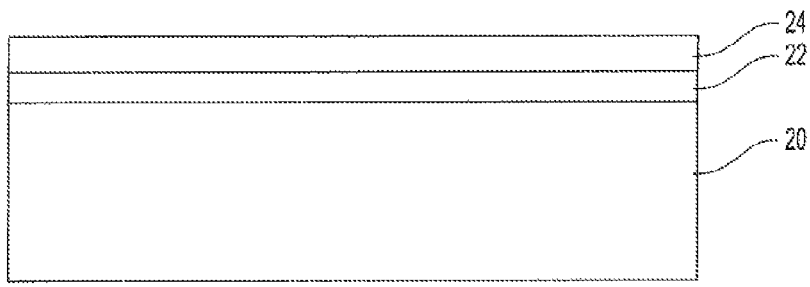
_Fig-1_
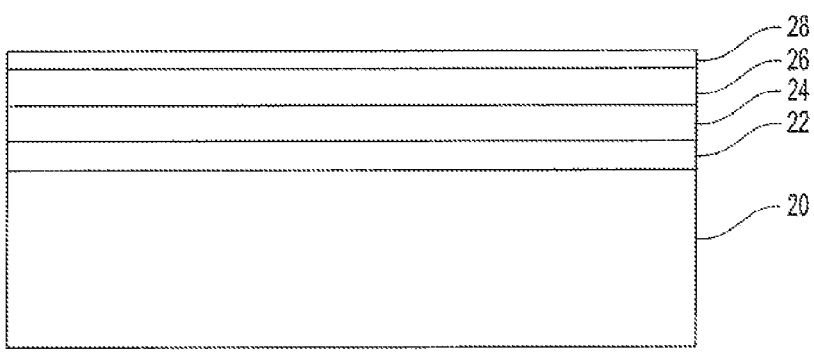
_Fig-2_
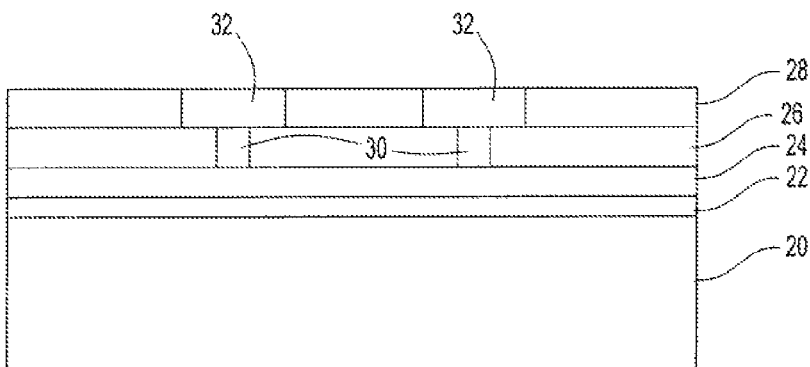
_Fig-3_
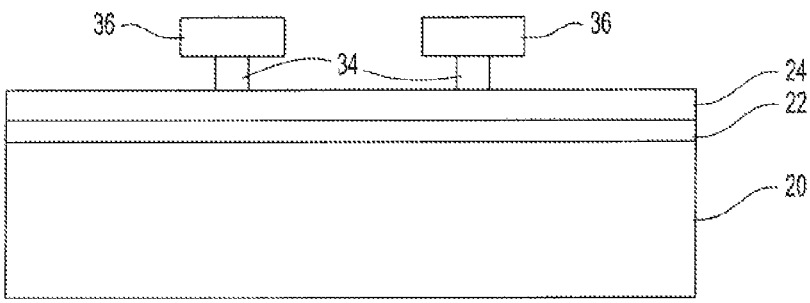
_Fig-4_

METHOD FOR FORMING A DEVICE HAVING NANOPILLAR AND CAP STRUCTURES

GOVERNMENT INTEREST

The invention described herein may be manufactured, used, and licensed by or for the United States Government.

FIELD OF THE INVENTION

The present invention relates generally to semiconductor devices and, more particularly, a method for forming a nanopillar and cap structure for the fabrication of STT RAM.

BACKGROUND OF THE INVENTION

Certain electronic devices, such as STT RAM, require that a plurality of rings of a magnetoresistive stack be deposited on a substrate. These rings have been previously formed by ion beam milling which creates the center hole for the ring. Ion beam milling, however, suffers from a number of disadvantages.

One disadvantage of the ion beam milling is that the process is serial and, for that reason, very slow in manufacturing time. Such ion beam milling also leads to the redeposition of the magnetic tunnel junction material on the nanoring surface which leads to shorting of the device.

Another process that is currently used to create the rings of magnetoresistive material on the substrate for STT RAM involves the reactive ion etching of the magnetic tunnel junction. In this method, methanol is used to assist with the etching process. A primary disadvantage of this process, however, is that it is only possible to etch 20-30 nm in the vertical direction with this process. With an STT RAM application, however, that is insufficient.

A final process that is currently used to form the rings of magnetoresistive material for STT RAM involves the use of polystyrene nanospheres. In particular, it has been shown that it is possible to define the center hole of the nanoring using an ordered array of nanospheres. However, in practice it has proven difficult to obtain an ordered array on a large-scale area. Instead, the nanospheres tend to be arranged in a hexagonal array that is less than ideal for forming the contacts involving random access memory, such as STT RAM.

SUMMARY OF THE INVENTION

The present invention provides a method for forming nanopillar and cap structures on a substrate that is particularly useful for manufacturing STT RAM. However, the method of the present invention may also be used for other types of products such as membranes, filters, and other ring-shaped devices.

In brief, in a first embodiment of the invention, a substrate is spin coated with a negative resist having a high exposure dose to electron beam radiation. After the first negative resist is baked, a negative resist having a low exposure dose to electron beam radiation is spin coated on top of the first negative resist and baked.

Thereafter, electron beam lithography at a high level dose is performed in the areas of the nanopillar to expose the first negative resist. Electron beam lithography is then performed at a low dose in the areas of the caps to expose the second negative resist. Thereafter, both the first and second negative resists are developed so that the bilayer resist structure forms both the nanopillar as well as the cap on top of the nanopillar that is greater in cross-sectional area than the nanopillar.

In an alternative embodiment of the invention, a substrate is spin coated with a positive resist having a low exposure dose to electron beam radiation. After the first positive resist is baked, a positive resist having a high exposure dose to electron beam radiation is spin coated on top of the first positive resist and baked.

Thereafter, electron beam lithography at a high level dose is performed in the areas between the caps of each of the structures to expose both layers of positive resist. Electron beam lithography is then performed at a low dose in the areas of the cap where the nanopillar is not present. Thereafter, both the first and second positive resists are developed so that the bilayer resist structure forms both the nanopillar as well as the cap on top of the nanopillar that is greater in cross-sectional area than the nanopillar.

Once the nanopillar and cap structures are formed on the substrate, STT RAM may then be produced by first depositing a tunneling magnetoresistive stack over the caps and exposed areas of the substrate. A sidewall spacer is then formed on top of each cap wherein each sidewall spacer has a portion that extends laterally outwardly from its associated cap so that the nanoring is defined between the outer periphery of the sidewall spacer and the nanopillar.

Thereafter, the tunneling magnetoresistive stack is etched so that only the portions of the tunneling magnetoresistive stack covered by the sidewall spacer and around the nanopillar remain. The sidewall spacers are then removed in any conventional way, such as a chemical etch, and a dielectric layer is then deposited over the remaining portions of the tunneling magnetoresistive stack. After planarizing via micromachining, the electrical contact for the nanoring is then deposited on top of the insulating material covering the nanoring.

In an alternative embodiment of the invention, the substrate is covered with a layer of first positive resist and second positive resist, thus forming a bilayer resist structure. Thereafter, electron beam lithography is performed at a high level dose in the areas of the nanopillar to expose both layers of positive resist. Electron beam lithography is carried out at a low exposure dose in the areas of the cap in order to expose the second positive resist. The positive resists are then developed thus removing the exposed areas and leaving a template for the nanopillar and cap structure.

Thereafter, a material, such as silicon or silicon dioxide, is deposited on the substrate so that the deposited material forms both the nanopillar and its associated cap. Thereafter, the device, such as an STT RAM device, is manufactured in the same fashion as the first embodiment of the invention.

BRIEF DESCRIPTION OF THE DRAWINGS

A better understanding of the present invention will be had upon reference to the following detailed description when read in conjunction with the accompanying drawing, wherein like reference characters refer to like parts throughout the several views, and in which:

FIG. 1 is a side view illustrating an initial step of the method of the present invention;

FIG. 2 is a view similar to FIG. 1, but illustrating a subsequent step;

FIG. 3 is a view similar to FIG. 2, but illustrating a subsequent step;

FIG. 4 is a view similar to FIG. 3, but illustrating a subsequent step of the method of the present invention;

DETAILED DESCRIPTION OF THE PREFERRED EMBODIMENTS

Figure 5:
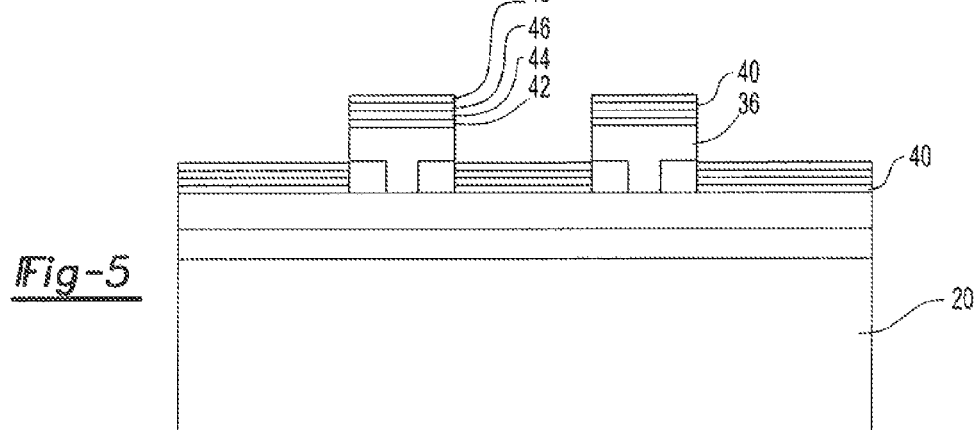
FIG. 5 is a view illustrating an initial step in the manufacture of an STT RAM device using the substrate and nanopillar and cap structure of FIG. 4.

With reference first to FIG. 1, a substrate 20 is illustrated which is constructed of any conventional material, such as silicon. An insulating layer 22, which may be constructed of silicon dioxide, is deposited over a top surface of the substrate 20. For a bottom contact 24, a positive resist is spin coated onto layer 22 and patterned using electron beam lithography. The bottom contact 24 is thereafter deposited and a lift-off process is carried out to remove the excess bottom contact material.

With reference now to FIG. 2, a first negative resist layer 26 of the type used with electron beam lithography is coated over the contact layer 24. Any conventional means may be used to coat the first resist layer 26 over the contact layer 24 such as by spin coating the first resist over the contact layer 24. The first resist layer 26, furthermore, possesses a high exposure dose for electron beam lithography.

Still referring to FIG. 2, after the first resist layer 26 has been baked, a second negative resist layer 28 is coated over the first resist layer 26 in any conventional fashion, such as by spin coating. The second resist layer 28, however, has a lower exposure dose to electron beam lithography than the first resist layer 26. The layers 26 and 28 thus form a bilayer resist structure on top of the substrate 20.

In an alternative embodiment of the invention, a first positive electron beam resist layer 26 is coated over the contact layer 24 using spin coating. The first positive resist layer would possess a low exposure dose for electron beam lithography. After the first resist layer 26 has been baked, a second positive resist layer 28 would be spin coated over the first resist layer 26 and baked. The second positive resist layer 28 would have a higher exposure dose to electron beam lithography than the first resist layer 26. Layers 26 and 28 would once again form a bilayer resist structure on top of the substrate 20.

Assuming that the resist layers 26 and 28 are negative e-beam resists, the resist layers 26 and 28 are then subjected to a double exposure of electron beam lithography. In one exposure, a high dose of electron beam is applied to the areas 30 in the first resist layer 26 which form the areas of the nanopillars. The high energy dose of electron beam energy thus hardens the first resist layer 26 only in the areas 30 where nanopillars are desired.

During the second exposure, the resist layers 26 and 28 are exposed to a lower energy electron beam radiation in the areas 32 where the caps are desired. These caps overlie their associated nanopillar area 30 and are greater in cross-sectional size than their associated nanopillar area 30. During this radiation, however, the first resist layer 26 is unaffected by the electron beam radiation due to its higher exposure dose. Furthermore, either the high or lower energy electron beam radiation during the electron beam lithography may be first formed followed by the second electron beam exposure.

Assuming that the resist layers 26 and 28 are positive e-beam resists, the areas 28 between the caps of each of the structures would be subject to a high electron beam dose. After exposure is complete, a low electron beam dose would be applied in the areas of the caps 32 where the nanopillars 30 do not reside. During the second exposure, the second positive resist layer 28 is unaffected by the electron beam radiation due to its higher exposure dose.

With reference now to FIG. 4, following the double electron beam exposure, the unexposed portions of the resist layers 26 and 28 when using negative resists (exposed portions of the resist layers 26 and 28 when using positive resists) are removed in any conventional fashion, such as a resist developer, thus leaving the nanopillar 34 and cap 36 on the substrate 20 which, as described, actually contains several different layers 20 and 22 and the bottom contact 24.

Each nanopillar 34 is formed from the first resist layer 26 and each cap 36 is formed from the second resist layer 28. The resulting pillar and cap structure may be used in many different applications, such as STT RAM, membranes, filters, and other ring-shaped devices.

For example, with reference to FIG. 5 in order to manufacture STT RAM, a tunneling magnetoresistive stack 40 is first deposited over the substrate 20 and caps 36. The tunneling magnetoresistive (TMR) stack is conventional in construction and includes an anti-ferromagnetic layer 42, a ferromagnetic (fixed) layer 44, and an insulating barrier oxide 46 and a ferromagnetic (free) layer 48.

Figure 6:
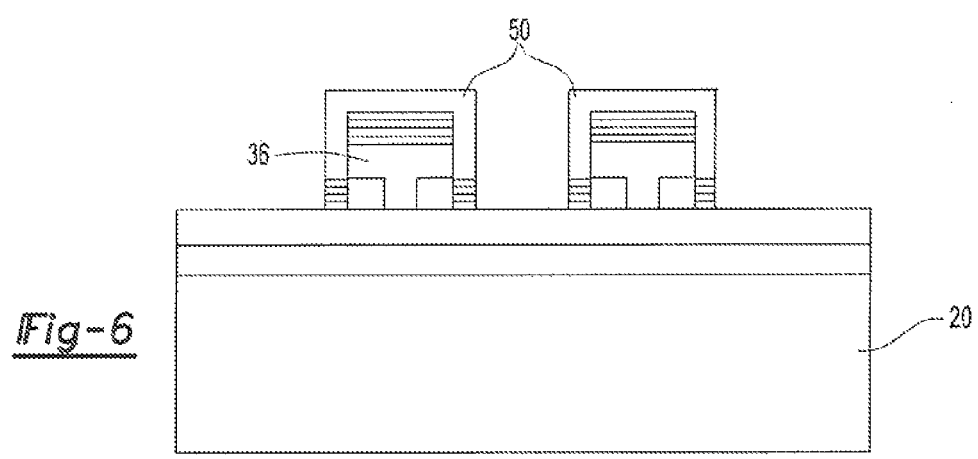
FIG. 6 is a view similar to FIG. 5, but illustrating a subsequent step thereof.
Figure 7:
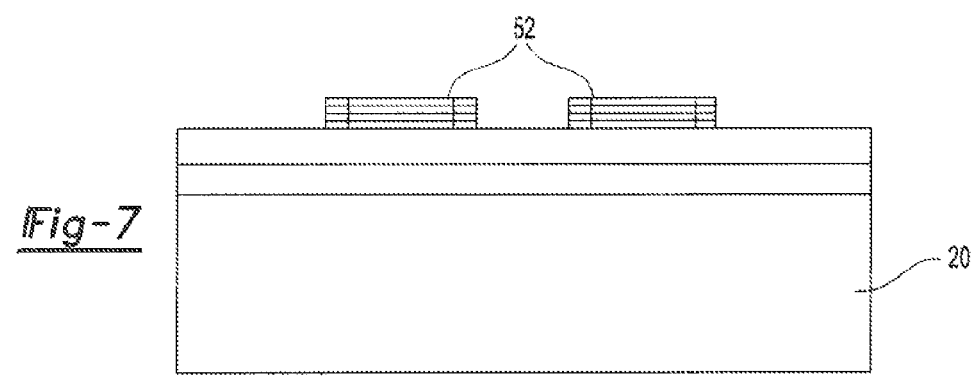
FIG. 7 is a view similar to FIG. 6, but illustrating a subsequent step thereof.
Figure 8:
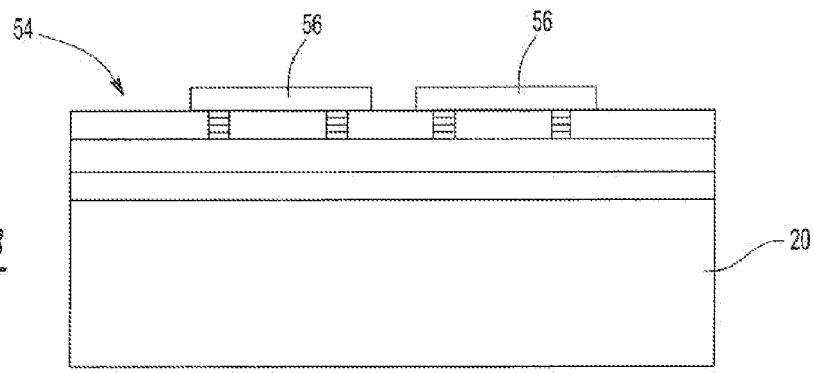
FIG. 8 is a side view of the completed device.
Figure 9:
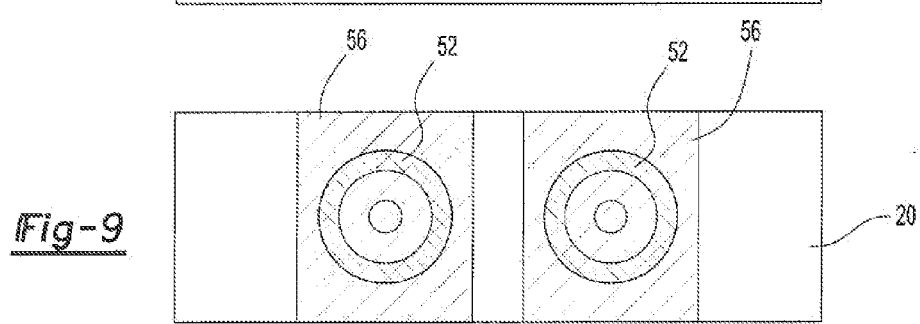
FIG. 9 is a top view of the completed device.

With reference now to FIG. 6, a sidewall spacer 50 is then deposited over each cap 36 by any conventional method, such as atomic layer deposition. This sidewall spacer 50, furthermore, has a cross-sectional size greater than the cap 36. Consequently, the area of the TMR stack 40 between the outer periphery of the spacer 50 and the outer periphery of the cap 36 forms a ring 52 which is round in shape. The excess TMR stack 40 is then etched away using conventional methods thus leaving the TMR stack 40 forming the ring below the sidewall spacer 50. The sidewall spacer 50 is then removed in any conventional fashion, such as a chemical etch, thus leaving the TMR ring structure shown in FIG. 7. With reference now to FIG. 8, in order to complete the STT RAM, the top surface of the overall device is first planarized as shown in layer 54 using any conventional method. The device is then coated with positive resist and patterned. Electrical contacts 56 are then deposited on top of each ring and lift-off is carried out to remove the excess material thus completing the STT RAM device as shown in FIGS. 8 and 9.

Figure 10:
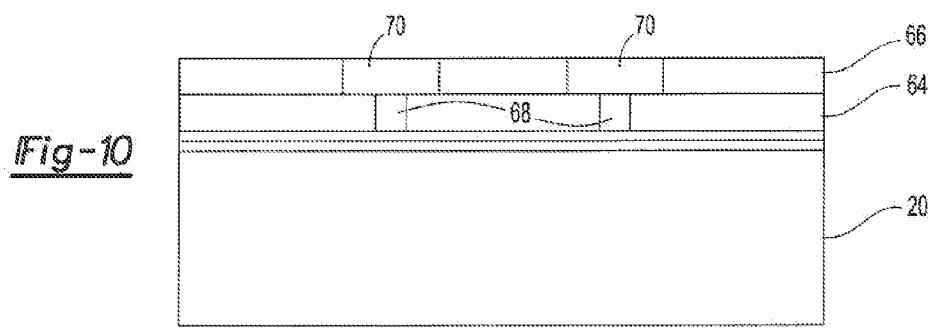
FIG. 10 is a view similar to FIG. 3, but illustrating a second preferred embodiment of the present invention.
Figure 11:
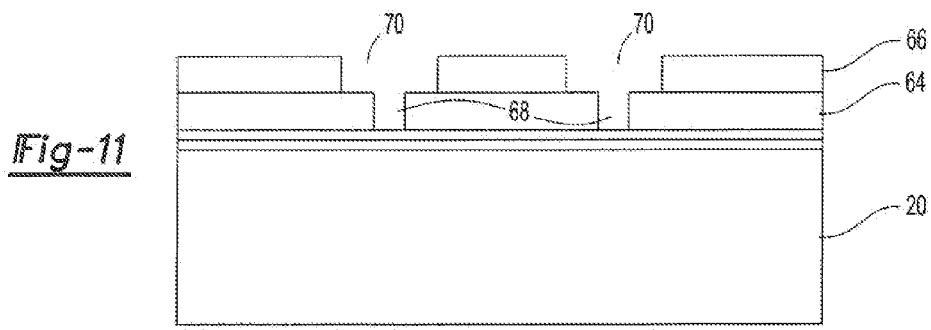
FIG. 11 is a view similar to FIG. 10, but illustrating a subsequent step thereof.

With reference now to FIG. 10, in a second embodiment of the invention the first positive resist layer 64 and second positive resist layer 66 are coated over the substrate 20 in the previously described fashion. However, rather than forming the nanopillar and cap structures from the bilayer resist material, a bilayer resist material is, instead, used to form a template for the deposition of other material, such as silicon or silicon dioxide, to form the nanopillar and cap structure.

More specifically, the positive e-beam resist layer 64 is coated over the substrate 20 by any conventional method, such as spin coating, and a second positive e-beam resist layer 66 is then coated over the first resist layer 64 in any conventional fashion, such as by spin coating. As before, the first resist layer 64 has a higher beam exposure than the second resist layer 66. The resist layers 64 and 66 are then subjected to a dual exposure electron beam radiation.

In one exposure, the areas 68 where the nanopillars are desired are exposed to high level electron beam. Similarly, the second and lower energy electron beam exposure is performed in the areas 70 where the caps are desired, i.e. overlying and of greater cross-sectional area than the nanopillar 68. At the completion of the dual exposure, the positive resists are removed from areas 68 and 70 using a resist developer. The rest of the substrate remains covered with the resist layers 64 and 66 so that the bilayer resist structure forms a template for the nanopillars and caps.

Figure 12:
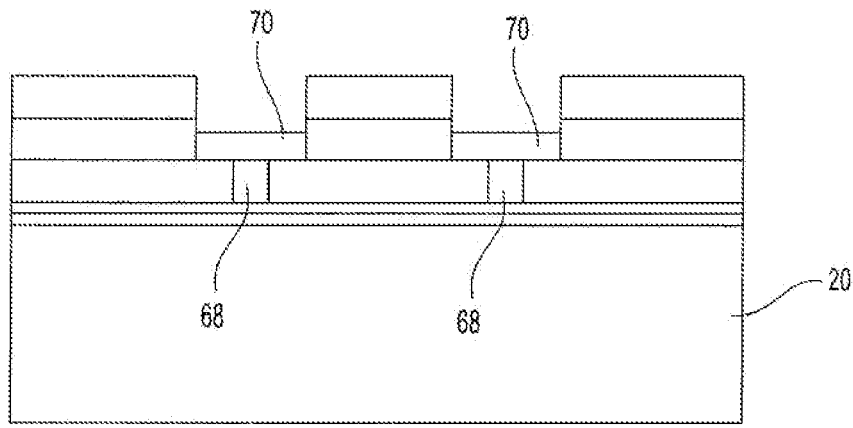
FIG. 12 is a view similar to FIG. 11, but illustrating a subsequent step thereof.
Figure 13:
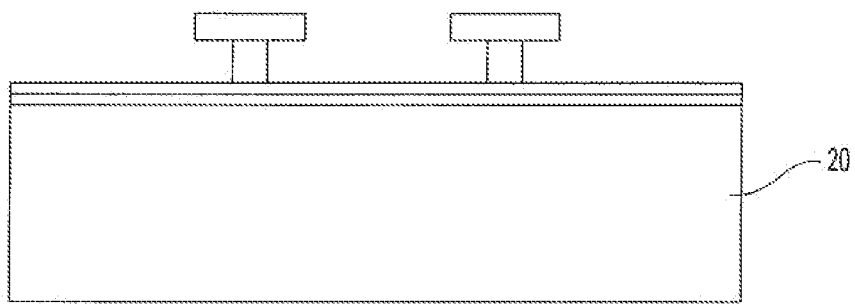
FIG. 13 view similar to FIG. 12, but illustrating a subsequent step thereof.

With reference now to FIG. 12, a material, such as silicon or silicon dioxide, is then deposited over the substrate thus filling the areas 68 and 70 defining the pillars and caps, respectively. Following that deposition, the remaining portions of the resist layers 64 and 66 are removed in any conventional fashion, such as a resist remover, thus leaving the nanopillar and cap structure on the substrate 20 structure as shown in FIG. 13. The subsequent manufacture of an electronic device, such as an STT RAM, may then be performed in the fashion previously described.

From the foregoing, it can be seen that the present invention provides a simple yet effective way of forming nanopillars and cap structures on a substrate. In describing our invention, however, many modifications thereto will become apparent to those of skill in the art to which it pertains without deviation from the spirit of the invention as defined by the scope of the independent claims.

We claim:

1. A method of forming a device having nanopillar and cap structures on a substrate comprising the steps of:
   coating the substrate with a first negative electron beam resist and baking said first resist to form a first resist layer having a first exposure dose to electron beam radiation,
   coating the first resist layer with a second negative electron beam resist and baking said second resist to form a second resist layer having a second exposure dose to electron beam radiation which is less than said first exposure dose,
   performing electron beam lithography at a first level dose in the areas of the nanopillars to thereby expose the first resist layer,
   performing electron beam lithography at a second level dose substantially lower than the first level dose in the areas of the caps to thereby expose the second resist layer, whereby the first resist layer is substantially unaffected by the second level dose, thereafter developing both the first and second resist; wherein the nanopillar structure and the cap structure of the formed device each comprise a cross sectional width, and the cross sectional width of the cap structure is greater than the cross sectional width of the nanopillar structure.

2. The method of claim 1 and further comprising the steps of:
   depositing a tunneling magnetoresistive stack over said caps and exposed areas of the substrate,
   forming a sidewall spacer on top of each cap, each said sidewall spacer having a portion which extends laterally outwardly from its associated cap,
   etching the tunneling magnetoresistive stack so that only the portions of the tunneling magnetoresistive stack covered by said sidewall spacer remain,
   removing said sidewall spacers,
   depositing a dielectric layer over the remaining portions of the tunneling magnetoresistive stack,
   depositing an electrical contact over the dielectric layer aligned with each remaining portion of the tunneling magnetoresistive stack.

3. The method of claim 1 and further comprising the step of planarizing an upper surface of the device after said step of removing said sidewall spacers.

4. The method of claim 1 wherein the device comprises spin transfer torque memory.

* * * * *